United States Patent [19]

Unsworth et al.

[11] Patent Number: 4,826,718

[45] Date of Patent: May 2, 1989

[54] ELECTROMAGNETIC SHIELDING LAMINATE

[75] Inventors: Mark A. Unsworth, St. Helens; Leslie T. Clarke, Wirral, both of England

[73] Assignee: Pilkington plc, Merseyside, England

[21] Appl. No.: 151,798

[22] Filed: Feb. 3, 1988

[30] Foreign Application Priority Data

Feb. 3, 1987 [GB] United Kingdom ................. 8702356

[51] Int. Cl.$^4$ ..................... H05K 9/00; G12B 17/02; B32B 17/10
[52] U.S. Cl. .................................. 428/175; 428/192; 428/256
[58] Field of Search ............... 428/175, 192, 256, 432, 428/437

[56] References Cited

U.S. PATENT DOCUMENTS

| | | | |
|---|---|---|---|
| 21,596 | 9/1858 | Cheever | 428/256 X |
| 265,302 | 10/1882 | Brigham | 428/256 |
| 3,431,348 | 3/1969 | Nellis et al. | 428/256 X |
| 4,631,214 | 12/1986 | Hasegawa | 428/256 X |
| 4,678,699 | 7/1987 | Ilritchevsky et al. | 428/175 |
| 4,755,422 | 7/1988 | Headrick et al. | 428/256 |

FOREIGN PATENT DOCUMENTS 0059063  9/1982  European Pat. Off. ............ 428/256

Primary Examiner—Nancy A. B. Swisher
Attorney, Agent, or Firm—Burns, Doane Swecker & Mathis

[57] ABSTRACT

An electromagnetic shielding laminate and method of producing such a laminate are disclosed. The laminate comprises a first pane of glass, or plastics, which includes an electro-conductive coating on one face thereof. A plastics interlayer, which is adjacent to the coating, is sandwiched between the first pane of glass and a second pane of glass, or plastics. A border of fine electroconductive mesh is located between the interlayer and the electroconductive coating and the mesh is arranged to be in electrical contact with the coating around the periphery of the coated pane.

8 Claims, 1 Drawing Sheet

ELECTROMAGNETIC SHIELDING LAMINATE

BACKGROUND OF THE INVENTION

The invention relates to electromagnetic shielding, and in particular to an electromagnetic shielding laminate and a method of producing such a laminate.

Electromagnetic shielding laminates comprising two panes of glass, a plastics interlayer between the panes and an electroconductive wire mesh embedded in the interlayer are known. In order to provide electromagnetic shielding, the whole area of the laminate must be electrically conductive, and the electroconductive element must be connected to earth around the whole periphery of the laminate. This is achieved by using a wire mesh which extends over the whole area of the laminate and beyond the edges of the laminate around the whole periphery of the laminate to make electrical contact with an electroconductive frame in which the laminate is mounted.

Another known form of electromagnetic shielding laminate comprises two panes of glass with a plastics film carrying an electroconductive coating between the panes. The coated plastics film extends beyond the periphery to make electrical contact, for example with a surrounding metal frame.

There are advantages to be gained by using glass carrying an electroconductive coating directly on the glass surface for electromagnetic shielding. However, when the coated glass is to be laminated with the coating inwards, a problem arises in making electrical contact with the electroconductive coating around the periphery of the laminate. The problem is more difficult to solve when the electroconductive coating comprises a non-conductive layer over an electroconducting layer, as for example in commercially available low emissivity coated glasses such as Pilkington's KAPPAFLOAT glass.

It has now been found that the problem can be overcome by including a border of fine conductive mesh in the laminate between a plastics interlayer and a pane carrying the electroconductive coating.

SUMMARY OF THE INVENTION

According to the present invention there is provided an electromagnetic shielding laminate comprising a first pane of glass or plastics with an electroconductive coating on its inner face, a plastics interlayer in contact with said coated inner face and a second pane of glass or plastics over said interlayer characterised by a border of fine electroconductive mesh between the interlayer and the electroconductive coating in electrical contact with said coating around the periphery of the coated pane.

The border of fine electroconductive mesh may extend beyond the edge of the pane to facilitate electrical connection to earth or may be connected e.g. soldered to electrical leads at the edge of the pane. Preferably it extends beyond the edge of the coated pane around the whole periphery of the pane. The electroconductive mesh is a fine mesh in order to ensure a uniform potential over the whole border of the coated pane; it preferably has a mesh size of less than 5 mm. It is preferably a mesh of metal wire, especially copper-plated steel.

The width of the border formed by the electroconductive mesh overlapping the coated pane is not critical providing it is sufficient to achieve satisfactory electrical contact with the electroconductive coating. It will usually be at least 5 mm wide, but not more than 25 mm wide.

The invention is especially useful when the electroconductive coating comprises a non-conducting layer over an electroconductive layer, since it is found, in practice, that the electroconductive mesh makes good electrical contact with the electroconductive layer on lamination. Electroconductive coatings which may be used include both semiconducting oxides, such as indium tin oxide, and coatings comprising a layer of metal sandwiched between layers of non-conductive metal oxide.

The first and second panes of the laminate are preferably of glass. The plastics interlayer is preferably of polyvinylbutyral, with the laminate being produced by autoclaving.

The invention further provides a method of producing an electromagnetic shielding laminate which comprises forming an assembly comprising a first pane of glass or plastics with an electroconductive coating on one face, a border of electroconductive mesh over said coating around the periphery of the coated pane, a plastics interlayer over said electroconductive coating and said border of electroconductive mesh, and a second pane of glass or plastics over said interlayer, prenipping said assembly by passing it between opposed rollers and autoclaving the pre-nipped assembly to form a laminate.

Preferably the plastics interlayer is placed over said second pane, the border of electroconductive mesh is placed over the plastics interlayer, and the mesh is heated locally to weld the mesh to the interlayer, before the coated pane of glass or plastics is placed over the interlayer.

The invention is illustrated but not limited by the following description with reference to the accompanying drawings in which

DESCRIPTION OF PREFERRED EMBODIMENT

Figure 1:
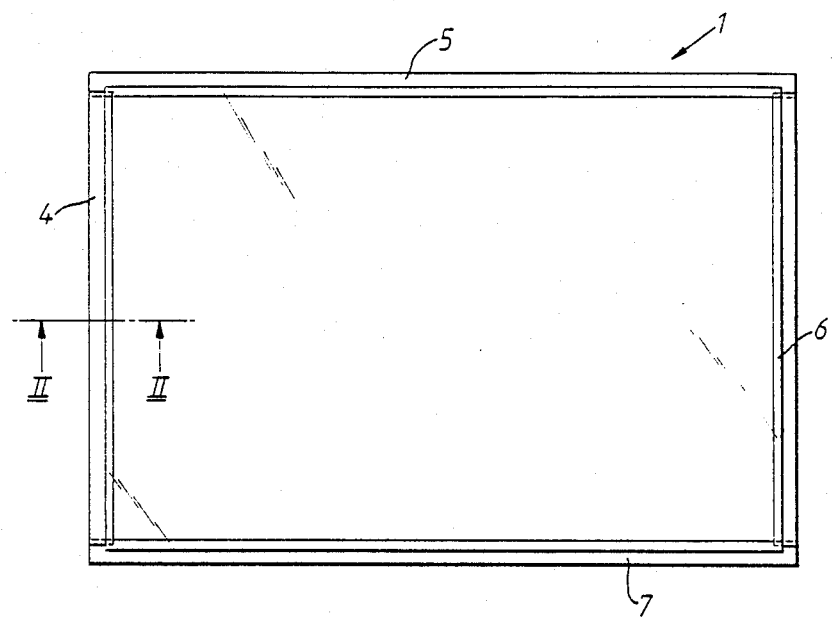
FIG. 1 is a plan view of a laminate in accordance with the invention
Figure 2:
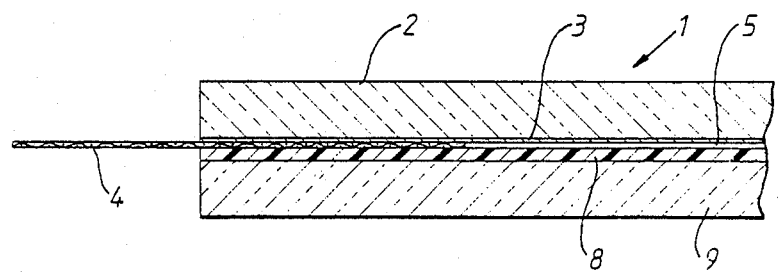
FIG. 2 is a section on an enlarged scale on the line II—II in FIG. 1.

The laminate shown, generally designated 1, comprises a first pane of glass 2 carrying an electroconductive coating 3. Four strips of fine electroconductive mesh, 4,5,6 and 7 lie along the edges of the laminate in electrical contact with the coating 3 and forming a border around the periphery of the laminate. The strips 4,5,6 and 7 extend beyond the edges of the pane 1 around the whole periphery of the coated pane, and overlap slightly at the corners to ensure there are no gaps between them.

The electroconductive mesh is embedded in a plastics interlayer 8 over the coated surface of the glass, and the plastics electroconductive mesh extends beyond the edge of the laminate around the whole periphery of the laminates, enabling the coating to be earthed around its periphery, for example, by glazing in a window frame of electroconductive metal with the electroconductive mesh in contact with the metal frame around the whole periphery of the laminate.

In the embodiment shown, the two outer panes, which are of glass, are of the same size and shape and are in registration with one another. It will be appreciated that this is not essential, for example, the uncoated pane could extend beyond the edges of the coated pane forming flanges along one or more edges of the laminate.

The production of one embodiment of the invention as shown in the drawings will now be described by way of Example.

A rectangular pane of 3 mm clear float glass coated with a translucent electroconductive coating comprising a layer of silver sandwiched between anti-reflection layers of tin oxide (produced as described in UK Pat. No. 2,129,831B) was cut to a size of 1500 mm×450 mm. The coating had a sheet resistance of $2\Omega/\square$ (measured with a 4 point probe).

A second pane of uncoated 3 mm clear float glass was cut to the same plan size and a rectangular sheet of 0.76 mm polyvinylbutyral, also 1500 mm×450 mm, was laid over the second pane in register with the pane. Four strips of WRAPSHIELD knitted wire mesh 25 mm wide and 0.4 mm thick were cut to length and laid along the edges of the pane as indicated in FIG. 1, with a small overlap at the corners. The strips were laid so as to overlap the glass pane by 10 mm and extend 15 mm beyond the edges of the pane. (The WAPSHIELD mesh used was a knitted mesh of tin plated, copper clad steel wire, and had a mesh size of about 1 mm. It is available in commerce from RFI Shielding Limited of Braintree, Essex, England). A soldering iron was used to weld the polyvinylbutyral to the metal mesh at intervals around the periphery of the polyvinylbutyral. The cut pane of coated 3 mm clear float glass, 1500 mm×450 mm, was then placed over the polyvinylbutyral and the mesh, in register with the polyvinylbutyral and the uncoated glass pane, and the assembly so formed 'pre-nipped' by passing it between a series of pairs of opposed press rollers with radiant heaters between adjacent pairs of rollers. The assembly was heated to a temperature in the range 120° C. to 130° C. and pressed under a load of 560 kPa (80 psi). It was then heated in an autoclave at a temperature of 135° C. and a pressure of 630 kPa (90 psi) to form a laminate with good electrical contact between the metal mesh and the coating. (To check the electrical contact, a similar laminate was produced with the strips of electroconductive along two opposite edges only. The contact resistance between the strips of mesh and the electroconductive coating was found to be 1 ohm).

Thus the present invention provides a simple and effective method of making electrical contact with electroconductive coatings on a glass pane incorporated in a laminate with the coating facing inwards, and thus facilitates the use of non-durable coatings in electromagnetic shielding windows.

What is claimed is:

1. An electromagnetic shielding laminate comprising in combination:
    a first pane of glass or plastics with an electroconductive coating on its inner face, the electroconductive coating comprising a non-conductive layer over an electroconductive layer;
    a plastics interlayer in contact with said coated inner face; and,
    a second pane of glass or plastics over said interlayer, characterised by a border of fine electroconductive mesh between the interlayer and the electroconductive coating in electrical contact with said coating around the periphery of the coated pane.

2. A laminate as claimed in claim 1, wherein the border of electroconductive mesh extends beyond the edges of the coated pane around the whole periphery of the pane.

3. A laminate as claimed in claim 1 or claim 2, wherein the electroconductive mesh is a mesh of metal wire.

4. A laminate as claimed in claim 3, wherein the electroconductive mesh is a mesh of copper-plated steel.

5. A laminate as claimed in claim 1, wherein the border of electroconductive mesh overlapping the coated pane is less than 25 mm wide.

6. A laminate as claimed in claim 1, wherein the electroconductive coating comprises a layer of metal sandwiched between layers of non-conductive metal oxide.

7. A laminate as claimed in claim 1, wherein said first and second panes are of glass.

8. A laminate as claimed in claim 1, wherein the plastics interlayer is of polyvinybutyral, and the laminate is produced by autoclaving.

* * * * *